United States Patent
Tu et al.

(10) Patent No.: US 10,700,175 B2
(45) Date of Patent: Jun. 30, 2020

(54) SHIELDED GATE MOSFET AND FABRICATING METHOD THEREOF

(71) Applicant: Force MOS Technology Co., Ltd., New Taipei (TW)

(72) Inventors: Kao-Way Tu, New Taipei (TW); Po-An Tsai, New Taipei (TW); Huan-Chung Weng, New Taipei (TW)

(73) Assignee: Force MOS Technology Co., Ltd., New Taipei (TW)

( * ) Notice: Subject to any disclaimer, the term of this patent is extended or adjusted under 35 U.S.C. 154(b) by 0 days.

(21) Appl. No.: 16/244,395

(22) Filed: Jan. 10, 2019

(65) Prior Publication Data

US 2020/0105890 A1 Apr. 2, 2020

(30) Foreign Application Priority Data

Sep. 27, 2018 (CN) .......................... 2018 1 1129396

(51) Int. Cl.
*H01L 29/78* (2006.01)
*H01L 29/423* (2006.01)
*H01L 29/40* (2006.01)

(52) U.S. Cl.
CPC ...... *H01L 29/42368* (2013.01); *H01L 29/401* (2013.01); *H01L 29/7813* (2013.01)

(58) Field of Classification Search
CPC ....... H01L 29/40; H01L 29/401; H01L 29/42; H01L 29/423; H01L 29/4236; H01L 29/42368; H01L 29/78; H01L 29/781; H01L 29/7813

USPC .......................................................... 257/330
See application file for complete search history.

(56) References Cited

U.S. PATENT DOCUMENTS 7,453,119 B2* 11/2008 Bhalla ................... H01L 29/407
257/330
7,982,265 B2* 7/2011 Challa ................. H01L 21/3065
257/341

* cited by examiner

*Primary Examiner* — Monica D Harrison
(74) *Attorney, Agent, or Firm* — Alan D. Kamrath; Karin L. Williams; Mayer & Williams PC

(57) ABSTRACT

A fabricating method of a shielded gate MOSFET is provided, includes the steps of forming a semiconductor substrate having a trench, forming a sacrifice oxide layer in the trench, the sacrifice oxide layer covering a side wall of the trench, forming a source polycrystalline silicon region in the trench, forming an insulation oxide layer above the source polycrystalline silicon region to have the source polycrystalline silicon region fully enclosed by the sacrifice oxide layer and the insulation oxide layer, depositing polycrystalline silicon into the trench and carrying out a back etching to control a thickness of the insulation oxide layer above the source polycrystalline silicon region, forming a gate oxide layer in the trench, the gate oxide layer covering the side wall of the trench, forming a gate polycrystalline silicon region in the trench, and forming a body layer and a heavily doped region around the trench in an ion implantation manner.

6 Claims, 7 Drawing Sheets

SHIELDED GATE MOSFET AND FABRICATING METHOD THEREOF

TECHNICAL FIELD

The instant disclosure relates to a trench metal-oxide-semiconductor field-effect transistor (MOSFET) and a fabricating method thereof and, more particularly, to a shielded gate MOSFET with an oxide layer of which a thickness is controllable and a fabricating method thereof.

RELATED ART

MOSFETs are widely used in switch components of power devices, e.g., power supplies, rectifiers, or low voltage motor controllers. Nowadays, most of MOSFETs adopt the vertical structure design, e.g., a trench MOSFET, to increase density of components. A structure of a shielded gate MOSFET, or a split-gate MOSFET, is usually adopted by manufacturers to improve the known trench MOSFET which has a gate-drain capacitor being too high, so as to lower the switching loss.

The shielded gate MOSFET has a structure that isolates a gate from a shielded electrode in the trench MOSFET into two electric potentials by a dielectric layer or an oxide layer. The gate at an upper position is used to form a channel of the MOSFET, and the electrode at a lower position is electrically connected to a source potential. The gate and the source are insulated from each other by the dielectric layer or the oxide layer. The oxide layer is required to reach sufficient quality and thickness to maintain a necessary voltage between the gate and the source.

There are two kinds of known fabricating method of a shielded gate MOSFET. One kind of the fabricating method is that while producing the gate oxide layer in a depositing or oxidizing manner, the isolation oxide layer between the source and the gate is produced at the same time. The advantage of the method is simple in fabricating process; however, the method results in a thinner isolation layer, and the uniformity of the isolation layer cannot be controlled. The insulation property between the gate and the source may be poor. The yield of chips may be low. To improve the above issues, the oxide layer must be made thicker. Consequently, a threshold voltage of the MOSFET will be increased, such that the types and applications of products will be limited.

The other kind of the fabricating method is to deposit a thick oxide layer and then to back etch to a preset depth of the gate. Forming the gate oxide layer and refilling the gate polycrystalline silicon are then carried out. The method can avoid non-uniformity of the thickness of the isolation oxide layer. However, the method requires special machine to perform, which is expensive. In addition, the depth control of the back etching must be of extremely accurate. Therefore, a fabricating method which is simple and cost less and can maintain the insulation property between the gate and the source, ensure the thickness of the oxide layer, and keep the yield of chips is desired.

SUMMARY

To address the above issues, an object of the instant disclosure is to provide a shielded gate MOSFET and a fabricating method thereof, which has no need of special machine and is simple and able to effectively control thickness of an oxide layer.

To achieve the above object, the instant disclosure provides a fabricating method of a shielded gate MOSFET, including steps of forming a semiconductor substrate having a trench, forming a sacrifice oxide layer in the trench in an oxidizing manner, the sacrifice oxide layer at least covering a side wall of the trench, forming a source polycrystalline silicon region in the trench, forming an insulation oxide layer above the source polycrystalline silicon region in an oxidizing manner to have the source polycrystalline silicon region fully enclosed by the sacrifice oxide layer and the insulation oxide layer, depositing polycrystalline silicon into the trench and carrying out a back etching to control a thickness of the insulation oxide layer above the source polycrystalline silicon region, forming a gate oxide layer in the trench in an oxidizing manner, the gate oxide layer at least covering the side wall of the trench, forming a gate polycrystalline silicon region in the trench, and forming a body layer and a heavily doped region around the trench in an ion implantation manner.

In an embodiment, the fabricating method of the shielded gate MOSFET further includes steps of before forming the gate oxide layer, depositing the polycrystalline silicon into the trench and carrying out the back etching to form a buffer polycrystalline silicon region to control the thickness of the insulation oxide layer above the source polycrystalline silicon region.

In an embodiment, the fabricating method of the shielded gate MOSFET further includes steps of while forming the gate oxide layer in an oxidizing manner, oxidizing the entire buffer polycrystalline silicon region to form a part of the gate oxide layer to control thicknesses of the insulation oxide layer and the gate oxide layer above the source polycrystalline silicon region.

In an embodiment, the fabricating method of the shielded gate MOSFET further includes steps of providing the semiconductor substrate, depositing a hard mask layer above the semiconductor substrate, laying out a trench pattern on the semiconductor substrate and the hard mask layer, and carrying out a dry etching to form the trench.

In an embodiment, the fabricating method of the shielded gate MOSFET further includes steps of depositing polycrystalline silicon to be electrically connected to a source, and replacing polycrystalline silicon region in a lower level of the trench with an electrode to form the source polycrystalline silicon region.

In an embodiment, the fabricating method of the shielded gate MOSFET further includes steps of forming a well region and the heavily doped region above the body layer in an ion implantation manner, forming an inner-layer dielectric (ILD) and a boro-phospho-silicate glass (BPSG) above the gate polycrystalline silicon region, and carrying out contact etching, implanting a contact region, and forming a metal layer and a metal mask layer.

In addition, the instant disclosure provides a shielded gate MOSFET, including a semiconductor substrate, an isolation oxide layer, a source polycrystalline silicon region, a gate polycrystalline silicon region, and a gate oxide layer. The semiconductor substrate has a trench. The isolation oxide layer is in the trench. The source polycrystalline silicon region is in a deeper first part of the trench and enclosed by the isolation oxide layer. The gate polycrystalline silicon region is in a shallower second part of the trench. The gate oxide layer is between the gate polycrystalline silicon region and the source polycrystalline silicon region. The isolation oxide layer and the gate oxide layer are for isolating the gate polycrystalline silicon region and the source polycrystalline silicon region. Wherein, thicknesses of the isolation oxide layer and the gate oxide layer are controlled by one or more times a process of depositing polycrystalline silicon into the trench and etching.

In an embodiment, the shielded gate MOSFET further includes a buffer polycrystalline silicon region between the isolation oxide layer and the gate oxide layer.

In an embodiment, materials of the gate polycrystalline silicon region and the source polycrystalline silicon region include polycrystalline silicon, doped polycrystalline silicon, metal, amorphous silicon, or a combination thereof. Wherein, materials of the isolation oxide layer and the gate oxide layer are silica.

In an embodiment, the semiconductor substrate includes a substrate and an epitaxy layer. The epitaxy layer epitaxially grows above the substrate.

DETAILED DESCRIPTION

Figure 1A:
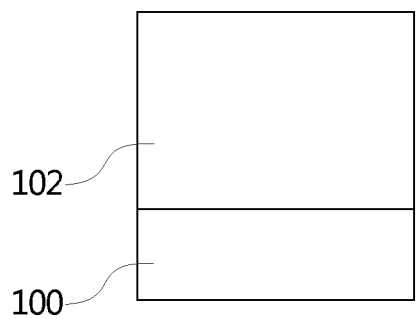
FIGS. 1A to 1E illustrate schematic cross sectional views in sequence regarding steps of fabrication of forming a trench and a sacrifice oxide layer according to an embodiment of the instant disclosure.

In the drawings, for showing clearly, relative thicknesses and positions of layers, regions, and/or components of structures may be smaller or larger comparing to their actual states, and some known components are omitted.

Figure 1B:
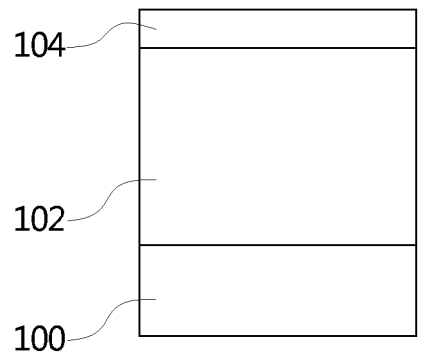
Figure 1C:
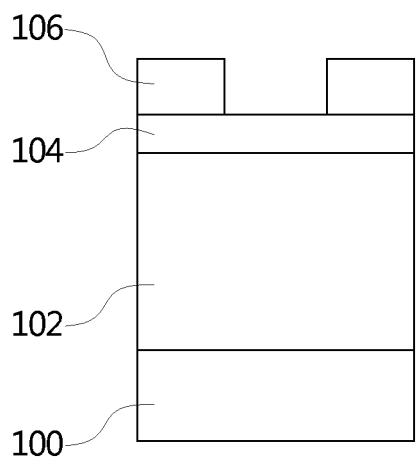
Figure 1D:
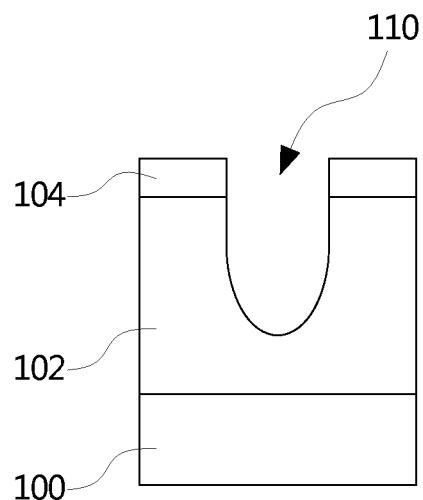
Figure 1E:
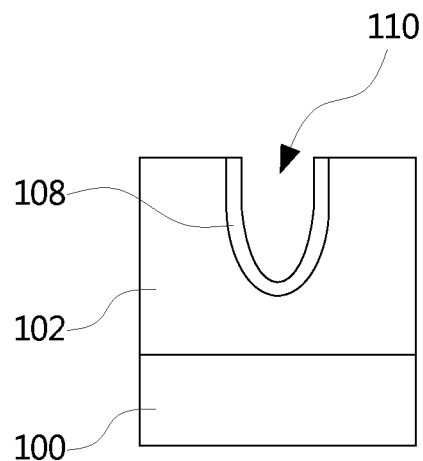

FIGS. 1A to 1E illustrate schematic cross sectional views in sequence regarding steps of fabrication of forming a trench 110 and a sacrifice oxide layer 108 according to an embodiment of the instant disclosure. As shown in FIG. 1A, in the embodiment, a semiconductor substrate is provided. The semiconductor substrate may include a substrate 100 and an epitaxy layer 102. The substrate 100 is formed by ion implanting a first conductive type of heavily doped element into a silicon substrate. The epitaxy layer 102 epitaxially grows above the substrate 100 and is formed by a first conductive type of soft doped element in an ion implantation manner. For instance, in an embodiment, the first conductive type is N type, and the second conductive type is P type. In another embodiment, the first conductive type is P type, and the second conductive type is N type. Next, as shown in FIG. 1B, a hard mask layer 104 is deposited above the epitaxy layer 102. As shown in FIG. 1C, a photoresistance 106 is applied on the hard mask layer 104. As shown in FIG. 1D, an etching process is carried out on the hard mask layer 104 by the photoresistance 106 in advance, and the photoresistance 106 is removed to define a position and scope of a trench. Next, the hard mask layer 104 is used as a mask to carry out an etching process on a part of the epitaxy layer 102 which is exposed. For example, a dry etching is used to lay out a trench pattern to form the trench 110, and the hard mask layer 104 is removed. As shown in FIG. 1E, the sacrifice oxide layer 108 is formed in the trench 110 in an oxidizing manner, and the sacrifice oxide layer 108 at least covers a side wall of the trench 110.

Figure 2A:
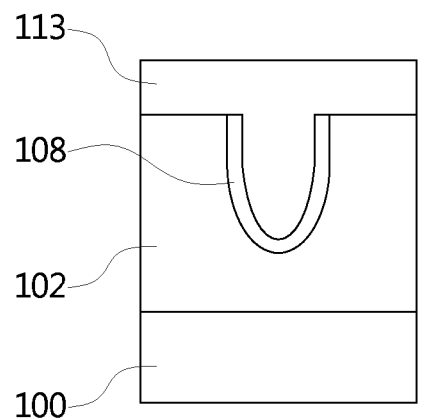
FIGS. 2A to 2C illustrate schematic cross sectional views in sequence regarding steps of fabrication of forming a source polycrystalline silicon region according to an embodiment of the instant disclosure.
Figure 2B:
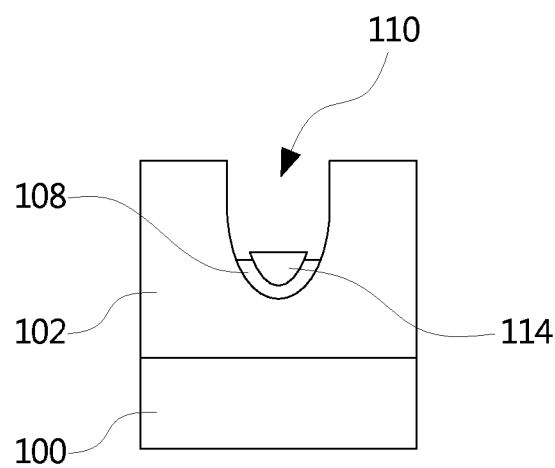
Figure 2C:
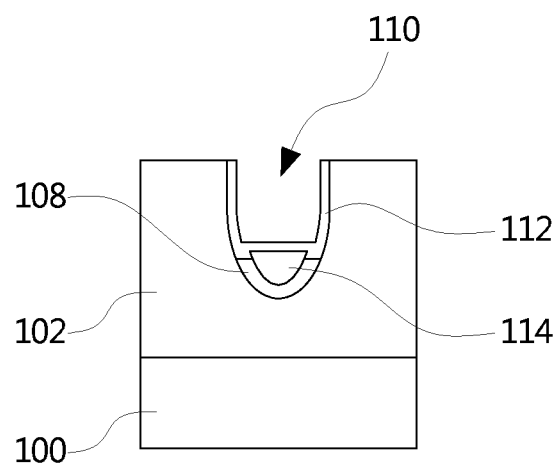

FIGS. 2A to 2C illustrate schematic cross sectional views in sequence regarding steps of fabrication of forming a source polycrystalline silicon region 114 according to an embodiment of the instant disclosure. As shown in FIG. 2A, a polycrystalline silicon 113 is deposited on the sacrifice oxide layer 108 in the trench 110 and is filled in the trench 110 by known deposition technique of polycrystalline silicon such as Chemical Vapor Deposition (CVD) and Physical Vapor Deposition (PVD), or by any other suitable film forming process. As shown in FIG. 2B, a known etching process, e.g., anisotropy etching, back etching, or dry etching, can be utilized to make the polycrystalline silicon 113 become thinner to form the source polycrystalline silicon region 114. For instance, the polycrystalline silicon can be deposited to be electrically connected to an external source, and polycrystalline silicon region in a lower level of the trench can be replaced with an electrode to form the source polycrystalline silicon region 114. An original gate-drain capacitor can be converted into a drain-source capacitor by the process, such that Miller capacitance can be significantly decreased, and the efficiency and speed of switching of components can be improved. As shown in FIG. 2C, an insulation oxide layer 112 is formed above the source polycrystalline silicon region 114 in an oxidizing manner to have the source polycrystalline silicon region 114 fully enclosed by the sacrifice oxide layer 108 and the insulation oxide layer 112. It is noted that in the process of the instant disclosure, before the deposition of the upper level gate polycrystalline silicon, there are steps of depositing a buffer polycrystalline silicon and etching (as illustration of FIGS. 3A to 3C as follows); therefore, a gate polycrystalline silicon region is not directly deposited above the insulation oxide layer 112. As a result, a thickness of the insulation oxide layer 112 can be controlled to maintain the evenness of the thickness.

Figure 3A:
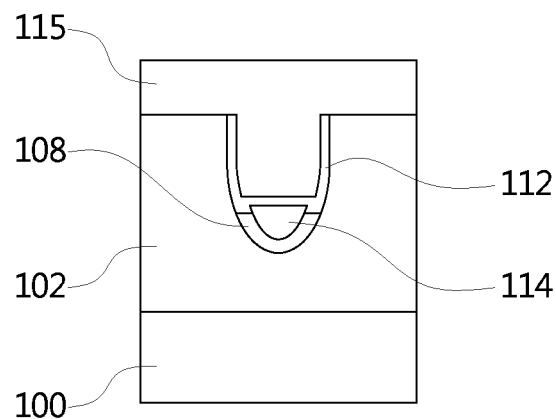
FIGS. 3A to 3C illustrate schematic cross sectional views in sequence regarding steps of fabrication of forming a buffer polycrystalline silicon region according to an embodiment of the instant disclosure.
Figure 3B:
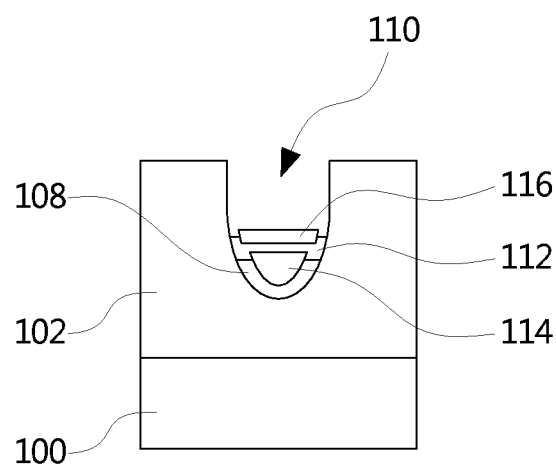
Figure 3C:
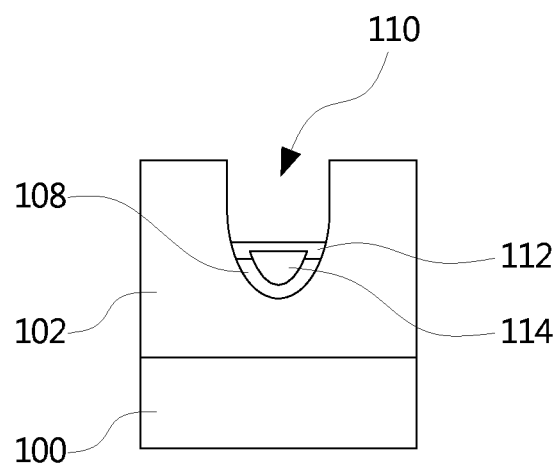
Figure 4A:
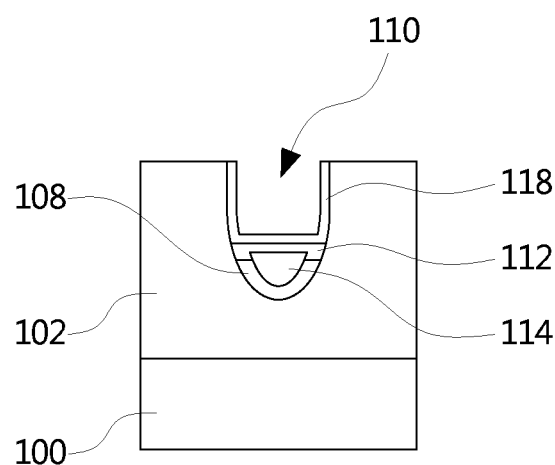
FIGS. 4A to 4C illustrate schematic cross sectional views in sequence regarding steps of fabrication of forming a gate polycrystalline silicon region according to an embodiment of the instant disclosure.
Figure 4B:
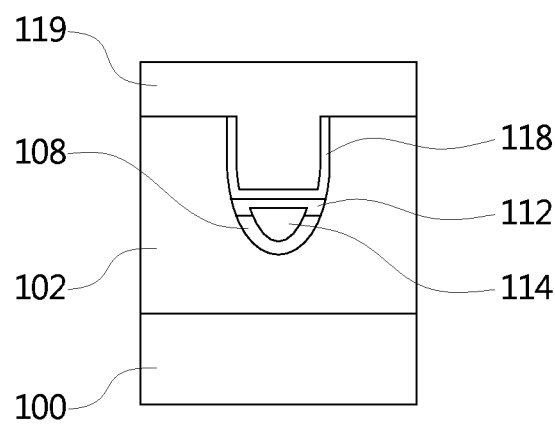
Figure 4C:
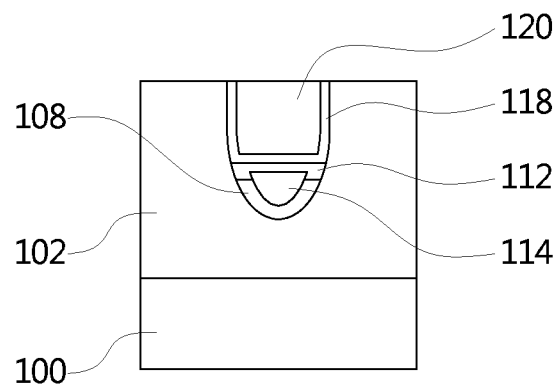

In a first preferred embodiment, after the processes as shown in FIGS. 1A to 1E and FIGS. 2A to 2C are carried out in sequence, processes of FIGS. 3A and 3B, FIGS. 4A to 4C, and FIGS. 5A to 5D are then carried out in sequence. Wherein, FIGS. 3A and 3B illustrate schematic cross sectional views in sequence regarding steps of fabrication of forming a buffer polycrystalline silicon region 116 according to an embodiment of the instant disclosure, FIGS. 4A to 4C illustrate schematic cross sectional views in sequence regarding steps of fabrication of forming a gate polycrystalline silicon region 120 according to an embodiment of the instant disclosure, and FIGS. 5A to 5D illustrate schematic cross sectional views in sequence regarding steps of fabrication of forming a body layer 122 and a heavily doped region 124 according to an embodiment of the instant disclosure. The sacrifice oxide layer 108, the insulation oxide layer 112, and a gate oxide layer 118 as shown in FIGS. 4A to 4C are all oxide layers and are produced in different steps of the fabrication. For showing clearly, they are deemed as one piece and thus there are not any border lines and characters thereof shown in the drawings.

In the first preferred embodiment, as shown in FIG. 3A, a polycrystalline silicon 115 is deposited above the insulation oxide layer 112 and a back etching is carried out to form the buffer polycrystalline silicon region 116 as shown in FIG. 3B. It is noted that a depth of the back etching is no need to be controlled precisely. While the buffer polycrystalline silicon region 116 has a thinner thickness by the back etching as shown in FIG. 3B, and the gate oxide layer 118 is formed in the trench 110 in an oxidizing manner as shown in FIG. 4A, the entire buffer polycrystalline silicon region 116 is oxidized to form a part of the gate oxide layer 118 to control thicknesses of the oxide layer. In the embodiment, the gate oxide layer 118 at least covers the side wall of the trench 110. Meanwhile, a doped concentration of the buffer polycrystalline silicon region 116 can be adjusted to alter the thickness of the growing gate oxide layer 118. As shown in FIGS. 4B and 4C, a polycrystalline silicon 119 is deposited again and is etched to form the gate polycrystalline silicon region 120 in the trench 110.

Figure 5A:
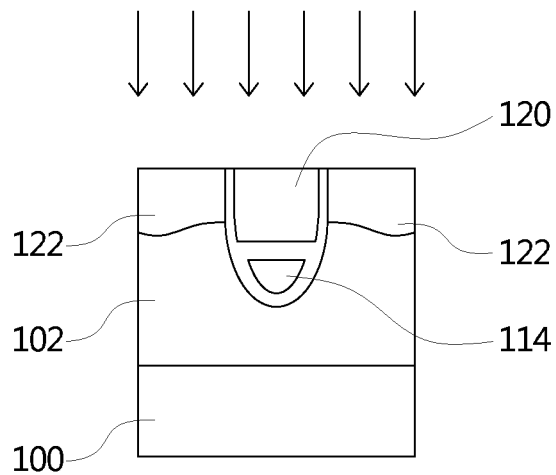
FIGS. 5A to 5D illustrate schematic cross sectional views in sequence regarding steps of fabrication of forming a body layer and a heavily doped region according to an embodiment of the instant disclosure.
Figure 5B:
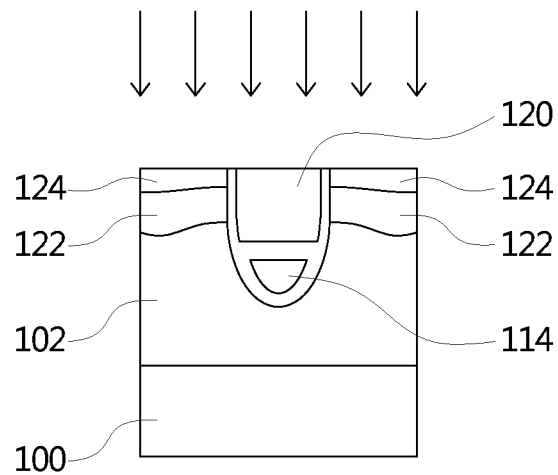
Figure 5C:
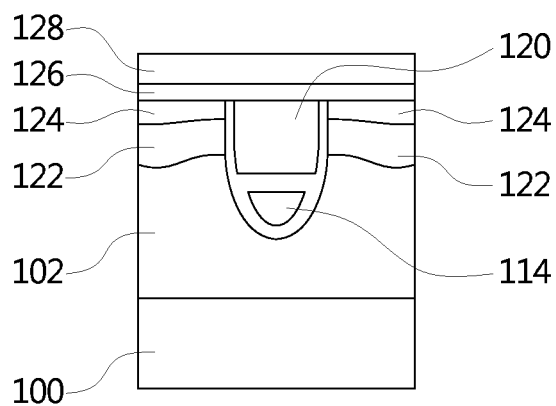
Figure 5D:
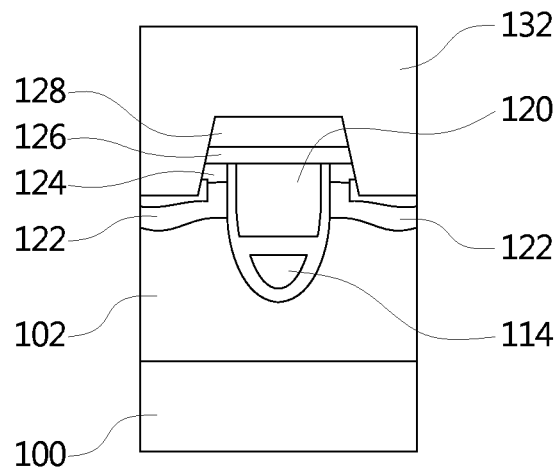

Next, as shown in FIG. 5A, a process of blanket body implantation and drive-in is carried out, so as to form the body layer 122, e.g., a P type well region, along an upper half of the epitaxy layer 102. As shown in FIG. 5B, a process of blanket body implantation and drive-in is carried out, so as to formed the heavily doped region 124, e.g., a N+ source region, along an upper side of the body layer 122. As shown in FIG. 5C, an inner-layer dielectric 126 and a boro-phospho-silicate glass 128 are formed above the gate polycrystalline silicon region 120. As shown in FIG. 5D, contact etching, implanting a contact region, and forming a metal layer and a metal mask layer 132 are carried out.

Figure 6A:
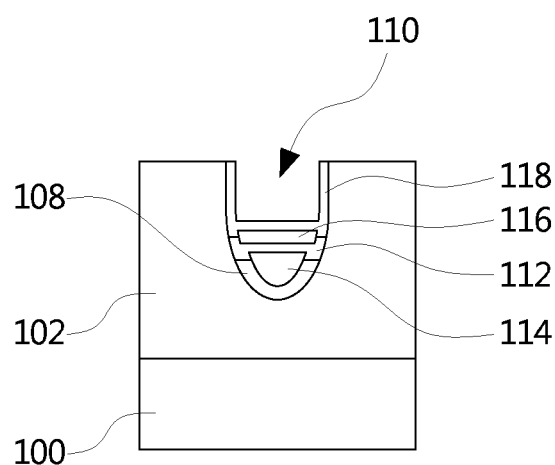
FIGS. 6A to 6C illustrate schematic cross sectional views in sequence regarding steps of fabrication of forming a gate polycrystalline silicon region according to another embodiment of the instant disclosure.
Figure 6B:
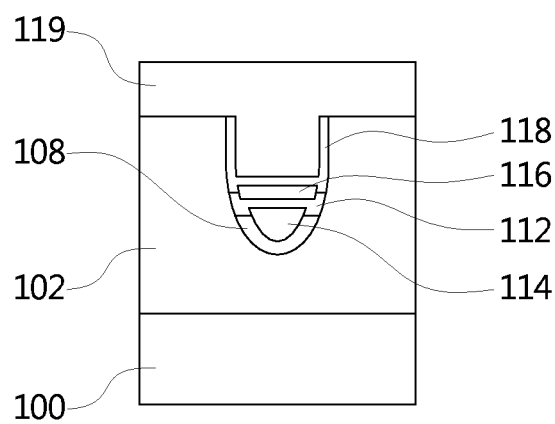
Figure 6C:
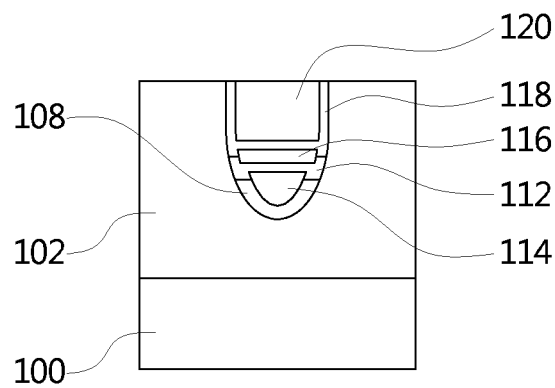

In a second preferred embodiment, after the processes as shown in FIGS. 1A to 1E and FIGS. 2A to 2C are carried out in sequence, processes of FIGS. 3A and 3B, FIGS. 6A to 6C, and FIGS. 7A to 7D are then carried out in sequence. Wherein, FIGS. 3A and 3B illustrate schematic cross sectional views in sequence regarding steps of fabrication of forming the buffer polycrystalline silicon region 116 according to an embodiment of the instant disclosure, FIGS. 6A to 6C illustrate schematic cross sectional views in sequence regarding steps of fabrication of forming a gate polycrystalline silicon region 120 according to another embodiment of the instant disclosure, and FIGS. 7A to 7D illustrate schematic cross sectional views in sequence regarding steps of fabrication of forming a body layer 122 and a heavily doped region 124 according to another embodiment of the instant disclosure. A sacrifice oxide layer 108, an insulation oxide layer 112, and a gate oxide layer 118 as shown in FIGS. 6A to 6C are all oxide layers and are produced in different steps of the fabrication. For showing clearly, they are deemed as one piece and thus there are not any border lines and characters thereof shown in the drawings.

In the second preferred embodiment, as shown in FIG. 3A, the polycrystalline silicon 115 is deposited above the insulation oxide layer 112 and a back etching is carried out to form the buffer polycrystalline silicon region 116 as shown in FIG. 3B. As shown in FIG. 6A, the gate oxide layer 118 is then formed in the trench 110 in an oxidizing manner, and the gate oxide layer 118 at least covers the side wall of the trench 110. As shown in FIGS. 6B and 6C, a polycrystalline silicon 119 is deposited again and is etched to form the gate polycrystalline silicon region 120 in the trench 110. It is noted that a depth of the back etching is no need to be controlled precisely. While the buffer polycrystalline silicon region 116 has a thickness by the back etching, a sandwich structure is formed. There are two oxide layers between the source and the drain. That is, the gate oxide layer 118 and the insulation oxide layer 112. In addition, the buffer polycrystalline silicon region 116 is of floating-potential. Even the buffer polycrystalline silicon region 116 and the above gate polycrystalline silicon region 120 are short-circuited, there is no electrical issue that will impact the yield.

Figure 7A:
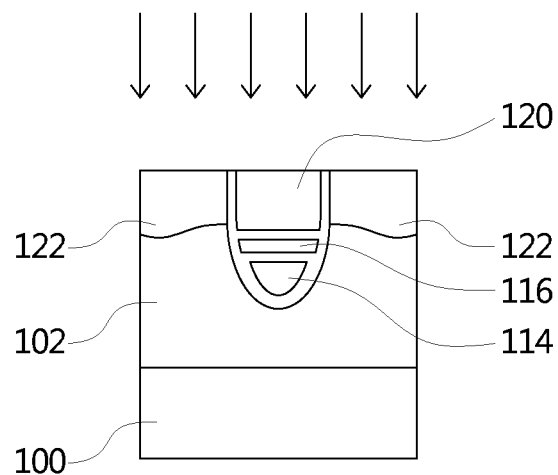
FIGS. 7A to 7D illustrate schematic cross sectional views in sequence regarding steps of fabrication of forming a body layer and a heavily doped region according to another embodiment of the instant disclosure.
Figure 7B:
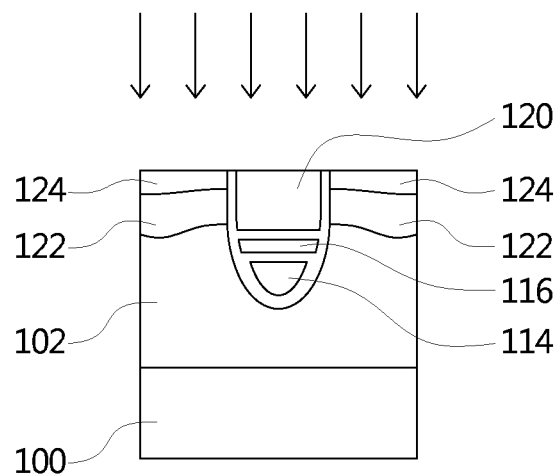
Figure 7C:
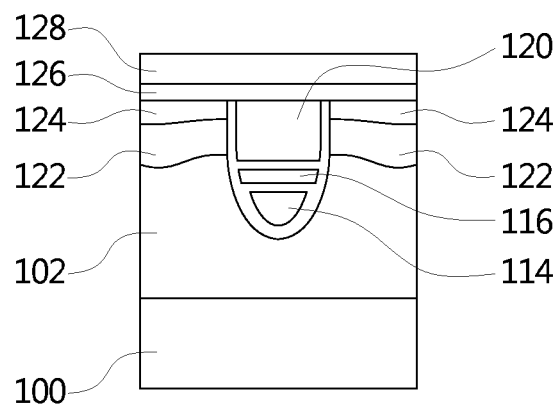
Figure 7D:
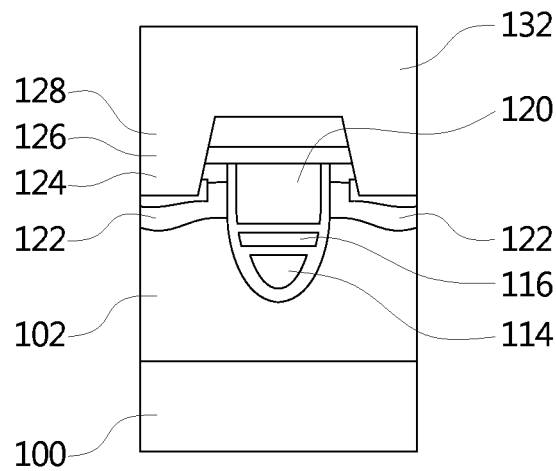

Next, as shown in FIG. 7A, a process of blanket body implantation and drive-in is carried out, so as to form the body layer 122, e.g., a P type well region, along an upper half of the epitaxy layer 102. As shown in FIG. 7B, a process of blanket body implantation and drive-in is carried out, so as to form the heavily doped region 124, e.g., a N+ source region, along an upper side of the body layer 122. As shown in FIG. 7C, an inner-layer dielectric 126 and a boro-phospho-silicate glass 128 are formed above the gate polycrystalline silicon region 120. As shown in FIG. 7D, contact etching, implanting a contact region, and forming a metal layer and a metal mask layer 132 are carried out.

In a third preferred embodiment, after the processes as shown in FIGS. 1A to 1E and FIGS. 2A to 2C are carried out in sequence, processes of FIGS. 3A to 3C, FIGS. 4A to 4C, and FIGS. 5A to 5D are then carried out in sequence. Wherein. FIGS. 3A and 3B illustrate schematic cross sectional views in sequence regarding steps of fabrication of forming the buffer polycrystalline silicon region 116 according to an embodiment of the instant disclosure.

In the third preferred embodiment, as shown in FIG. 3A, a polycrystalline silicon 115 is deposited above the insulation oxide layer 112 and a back etching is carried out. In addition, considering the precision issue of the back etching, after the buffer polycrystalline silicon region 116 shown in FIG. 3B is formed, the buffer polycrystalline silicon region 116 is then entirely etched to form a structure shown in FIG. 3C. As shown in FIG. 4A, the gate oxide layer 118 is formed in the trench 110 in an oxidizing manner, the gate oxide layer 118 at least covers the side wall of the trench 110. As shown in FIGS. 4B and 4C, a polycrystalline silicon 119 is deposited again and is etched to form the gate polycrystalline silicon region 120 in the trench 110. It is noted that even the deposited buffer polycrystalline silicon is entirely etched, the insulation property can still be ensured in the case that the insulation oxide layer 112 grows to be thicker in advance. In addition, the subsequent gate oxide layer 118 can grow to be thinner, such that the gate oxide layer 118 on the side wall of the trench 110 is thinner to reach a less threshold voltage.

Next, as shown in FIG. 5A, a process of blanket body implantation and drive-in is carried out, so as to form the body layer 122, e.g., a P type well region, along an upper half of the epitaxy layer 102. As shown in FIG. 5B, a process of blanket body implantation and drive-in is carried out, so as to form the heavily doped region 124, e.g., a N+ source region, along an upper side of the body layer 122. As shown in FIG. 5C, an inner-layer dielectric 126 and a boro-phospho-silicate glass 128 are formed above the gate polycrystalline silicon region 120. As shown in FIG. 5D, contact etching, implanting a contact region, and forming a metal layer and a metal mask layer 132 are carried out.

In an embodiment, as shown in FIG. 4C or 5D, a shielded gate MOSFET includes a semiconductor substrate, an isolation oxide layer (a sacrifice oxide layer 108 and an insulation oxide layer 112), a source polycrystalline silicon region 114, a gate polycrystalline silicon region 120, and a gate oxide layer 118. The semiconductor substrate has a trench. The isolation oxide layer is in the trench. The source polycrystalline silicon region 114 is in a deeper first part of the trench and enclosed by the isolation oxide layer. The gate polycrystalline silicon region 120 is in a shallower second part of the trench. The gate oxide layer 118 is between the gate polycrystalline silicon region 120 and the source polycrystalline silicon region 114. The isolation oxide layer and the gate oxide layer 118 are for isolating the gate polycrystalline silicon region 120 and the source polycrystalline silicon region 114. Wherein, thicknesses of the isolation oxide layer and the gate oxide layer 118 are controlled by one or more times a process of depositing polycrystalline silicon into the trench and etching. In another embodiment, as shown in FIG. 6C or 7D, a buffer polycrystalline silicon region 116 between the isolation oxide layer and the gate oxide layer can be formed by carrying out one or more times the process of depositing the polycrystalline silicon into the trench and etching.

In an embodiment, materials of the gate polycrystalline silicon region and the source polycrystalline silicon region include polycrystalline silicon, doped polycrystalline silicon, metal, amorphous silicon, or a combination thereof. Wherein, materials of the isolation oxide layer and the gate oxide layer are silica.

The purpose of the above recitation is for illustration. Every specific detail is for thorough understanding of the instant disclosure. People skilled in the art shall practice the instant disclosure without the need of certain detail therein. In other embodiments, known structures and devices are not shown in block diagrams. There may be a medium structure between components in the drawings. The components may include additional input and output, which are not shown in the drawings in detail.

While the recitation include "a component A being connected (or coupled) to a component B," the component A may be directly connected (coupled) to the component B, or may be indirectly connected (coupled) to the component B via a component C. While the recitation include "a component (feature, structure, procedure, or property) A resulting in a component (feature, structure, procedure, or property) B," it means that A is at least a part of a cause of B, or that there is another component (feature, structure, procedure, or property) which assists in causing B. The terms of "may, might, can, or could" mean a component (feature, structure, procedure, or property) not limited by the instant disclosure. The number or amount recited in the instant disclosure is not limited to "a," "an," or "one."

Regardless of the objects, means, or results of the invention, the features are significantly distinct from prior arts. It is noted that the embodiments are for illustratively showing the theory and function of the invention, but not for limiting the scope of the invention. While the instant disclosure has been described by way of example and in terms of the preferred embodiments, it is to be understood that the instant disclosure needs not be limited to the disclosed embodiments. Anyone skilled in the art may make modification and change to the embodiments without contradicting the theory and spirit of the invention. It shall be understood that for people in the art, various modifications and improvements of the disclosed components of the instant disclosure within the spirit of the instant disclosure are obvious and covered under the scope of the instant disclosure. The disclosed devices and methods shall not be limited and are covered by the scope of the appended claims.

What is claimed is:

1. A fabricating method of a shielded gate MOSFET, comprising steps of:
    forming a semiconductor substrate having a trench;
    forming a sacrifice oxide layer in the trench in an oxidizing manner, the sacrifice oxide layer at least covering a side wall of the trench;
    forming a source polycrystalline silicon region in the trench;
    forming an insulation oxide layer above the source polycrystalline silicon region in an oxidizing manner to have the source polycrystalline silicon region fully enclosed by the sacrifice oxide layer and the insulation oxide layer;
    depositing a polycrystalline silicon into the trench and carrying out a back etching to control a thickness of the insulation oxide layer above the source polycrystalline silicon region;
    forming a gate oxide layer in the trench in an oxidizing manner, the gate oxide layer at least covering the side wall of the trench;
    forming a gate polycrystalline silicon region in the trench; and
    forming a body layer and a heavily doped region around the trench in an ion implantation manner.

2. The fabricating method of the shielded gate MOSFET of claim 1, further comprising steps of: before forming the gate oxide layer, depositing the polycrystalline silicon into the trench and carrying out the back etching to form a buffer polycrystalline silicon region to control the thickness of the insulation oxide layer above the source polycrystalline silicon region.

3. The fabricating method of the shielded gate MOSFET of claim 2, further comprising steps of: while forming the gate oxide layer in an oxidizing manner, oxidizing the entire buffer polycrystalline silicon region to form a part of the gate oxide layer to control thicknesses of the insulation oxide layer and the gate oxide layer above the source polycrystalline silicon region.

4. The fabricating method of the shielded gate MOSFET of claim 1, further comprising steps of:
    providing the semiconductor substrate;
    depositing a hard mask layer above the semiconductor substrate;
    laying out a trench pattern on the semiconductor substrate and the hard mask layer; and
    carrying out a dry etching to form the trench.

5. The fabricating method of the shielded gate MOSFET of claim 1, further comprising steps of: depositing polycrystalline silicon to be electrically connected to a source, and replacing a polycrystalline silicon region in a lower level of the trench with an electrode to form the source polycrystalline silicon region.

6. The fabricating method of the shielded gate MOSFET of claim 1, further comprising steps of:
    forming a well region and the heavily doped region in an ion implantation manner;
    forming an inner-layer dielectric and a boro-phospho-silicate glass above the gate polycrystalline silicon region; and
    carrying out contact etching, implanting a contact region, and forming a metal layer and a metal mask layer.

* * * * *